United States Patent
Lu (10) Patent No.: US 8,648,638 B2
(45) Date of Patent: Feb. 11, 2014

(54) ELECTRONIC CHIPS WITH SLEW-RATE CONTROL AT OUTPUT SIGNALS

(75) Inventor: Wu-Hung Lu, New Taipei (TW)

(73) Assignee: Via Telecom Co., Ltd., George Town, Grand Cayman (KY)

( * ) Notice: Subject to any disclaimer, the term of this patent is extended or adjusted under 35 U.S.C. 154(b) by 70 days.

(21) Appl. No.: 13/397,087

(22) Filed: Feb. 15, 2012

(65) Prior Publication Data

US 2013/0176064 A1    Jul. 11, 2013

(30) Foreign Application Priority Data

Jan. 6, 2012 (CN) .......................... 2012 1 0003001

(51) Int. Cl.
*H03K 5/12* (2006.01)
(52) U.S. Cl.
USPC .......................................... 327/170; 327/108
(58) Field of Classification Search
None
See application file for complete search history.

(56) References Cited

U.S. PATENT DOCUMENTS

| | | | |
|---|---|---|---|
| 5,519,338 A | 5/1996 | Campbell et al. | |
| 5,877,647 A * | 3/1999 | Vajapey et al. | 327/391 |
| 6,400,546 B1 | 6/2002 | Drapkin et al. | |
| 6,940,436 B2 | 9/2005 | Hezar et al. | |
| 7,154,315 B2 * | 12/2006 | Kim | 327/170 |
| 7,187,197 B2 * | 3/2007 | Tripathi et al. | 326/29 |
| 7,471,111 B2 | 12/2008 | Seth et al. | |
| 7,660,064 B2 | 2/2010 | Howley et al. | |
| 7,679,540 B2 | 3/2010 | Ceballos et al. | |
| 7,692,463 B2 * | 4/2010 | Hargan | 327/170 |
| 7,696,808 B2 * | 4/2010 | Wong et al. | 327/384 |
| 7,902,885 B2 * | 3/2011 | Chauhan et al. | 327/117 |
| 8,456,211 B2 * | 6/2013 | Chen et al. | 327/170 |
| 2003/0058005 A1 * | 3/2003 | Nolan | 327/108 |

* cited by examiner

*Primary Examiner* — Cassandra Cox
(74) *Attorney, Agent, or Firm* — McClure, Qualey & Rodack, LLP (57) ABSTRACT

Electronic chips with slew-rate control at output signals are disclosed. A disclosed electronic chip includes a slew-rate control circuit and slew-rate control charging and discharging transistors wherein the transistors are coupled at an output pin of the electronic chip. According to an input signal for an output stage of the electronic chip and a signal at the output pin, the slew-rate control circuit generates the slew-rate control charging and discharging signals to separately control the slew-rate control charging and discharging transistors to charge/discharge a load capacitance at the output pin.

17 Claims, 5 Drawing Sheets

ELECTRONIC CHIPS WITH SLEW-RATE CONTROL AT OUTPUT SIGNALS

CROSS REFERENCE TO RELATED APPLICATIONS

This Application claims priority of China Patent Application No. 201210003001.2, filed on Jan. 6, 2012, the entirety of which is incorporated by reference herein.

BACKGROUND OF THE INVENTION

1. Field of the Invention

The present invention relates to slew-rate control for output signals of an electronic chip, and in particular relates to slew-rate control for output signals of an electronic chip used in suppression of current overshoot when the output signal charges/discharges a load capacitance.

2. Description of the Related Art

As manufacturing process advances and the operating frequency of electronic chips are enhanced, the rising/falling time of a signal is restricted to a finite interval and the operating voltage of electronic chips is lowered. Considering the aforementioned issues, current overshoot problems must be taken into consideration more carefully in the slew-rate control of digital output stage circuits, to suppress power noise, electromagnetic interferences (EMI) and latch up problems.

BRIEF SUMMARY OF THE INVENTION

Electronic chips with slew-rate control at output signals are disclosed.

An electronic chip in accordance with an exemplary embodiment of the invention comprises a slew-rate control circuit, a slew-rate control charging transistor and a slew-rate control discharging circuit. The slew-rate control charging and discharging transistors are coupled to an output pin of the electronic chip. Based on an output stage input signal of the electronic chip and a signal at the output pin, the slew-rate control circuit generates a slew-rate control charging signal and a slew-rate control discharging signal to separately control the slew-rate charging and discharging transistors to charge/discharge a load capacitance at the output pin.

In another exemplary embodiment of the invention, an electronic chip comprising a plurality of slew-rate control circuits and multiple sets of slew-rate control charging and discharging transistors is disclosed, wherein the multiple sets of slew-rate control charging and discharging transistors are coupled to an output pin of the electric device. Based on an output stage input signal of the electric device and a signal at the output pin, the plurality of slew-rate control circuits generate multiple sets of slew-rate control charging and discharging signals which correspond to the multiple sets of slew-rate control charging and discharging transistors. Note that the different slew-rate control circuits generate distinct sets of slew-rate control charging and discharging signals. The multiple sets of slew-rate control charging and discharging signals control the multiple sets of slew-rate control charging and discharging transistors separately, to charge/discharge a load capacitance at the output pin.

In another exemplary embodiment, an electronic chip comprising a plurality of slew-rate control circuits and multiple sets of slew-rate control charging and discharging transistors is disclosed, wherein the multiple sets of slew-rate control charging and discharging transistors are coupled to an output pin of the electric device. Based on an output stage input signal of the electronic chip and a signal at the output pin, the plurality of slew-rate control circuits generate multiple sets of slew-rate control charging and discharging signals which correspond to the multiple sets of slew-rate control charging and discharging transistors. The multiple sets of slew-rate control charging and discharging signals control the multiple sets of slew-rate control charging and discharging transistors separately, to charge/discharge a load capacitance at the output pin. Note that in this exemplary embodiment the slew-rate control circuits are selectively enabled and the number of enabled slew-rate control circuits depends on the size of the load capacitance.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows several exemplary embodiments carrying out the invention. This description is made for the purpose of illustrating the general principles of the invention and should not be taken in a limiting sense. The scope of the invention is best determined by reference to the appended claims.

Figure 1:
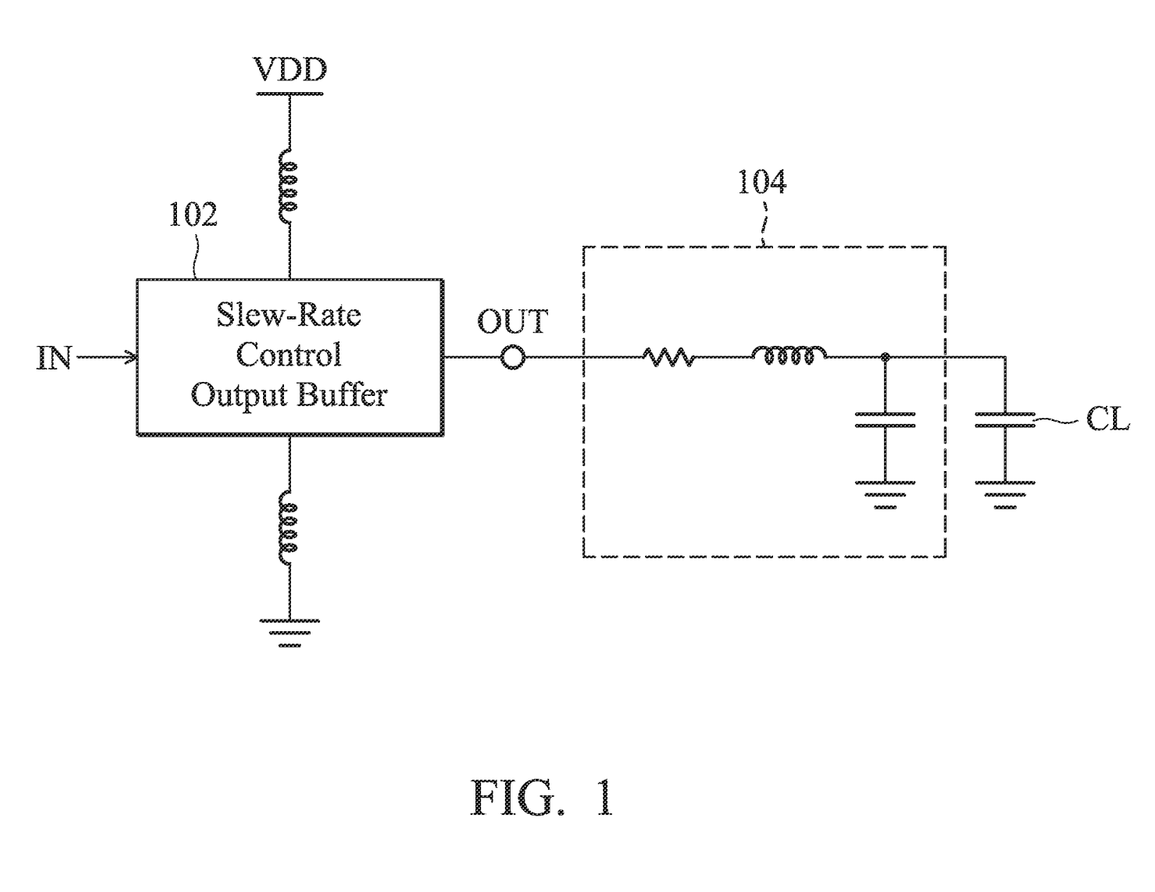
FIG. 1 illustrates an output stage of the disclosed electronic chip.

FIG. 1 depicts an output stage design of the disclosed electronic chip. As shown, the disclosed output stage comprises a slew-rate control output buffer 102, by which an output stage input signal IN is slew-rate controlled and buffered and then transferred to an output pin OUT of the electronic chip. Further, in FIG. 1, the parasitic resistance and inductance and capacitance of the packaging and printed circuit board is shown in a circuit 104, and the capacitance externally coupled to the output pin OUT is symbolized as CL.

Figure 2:
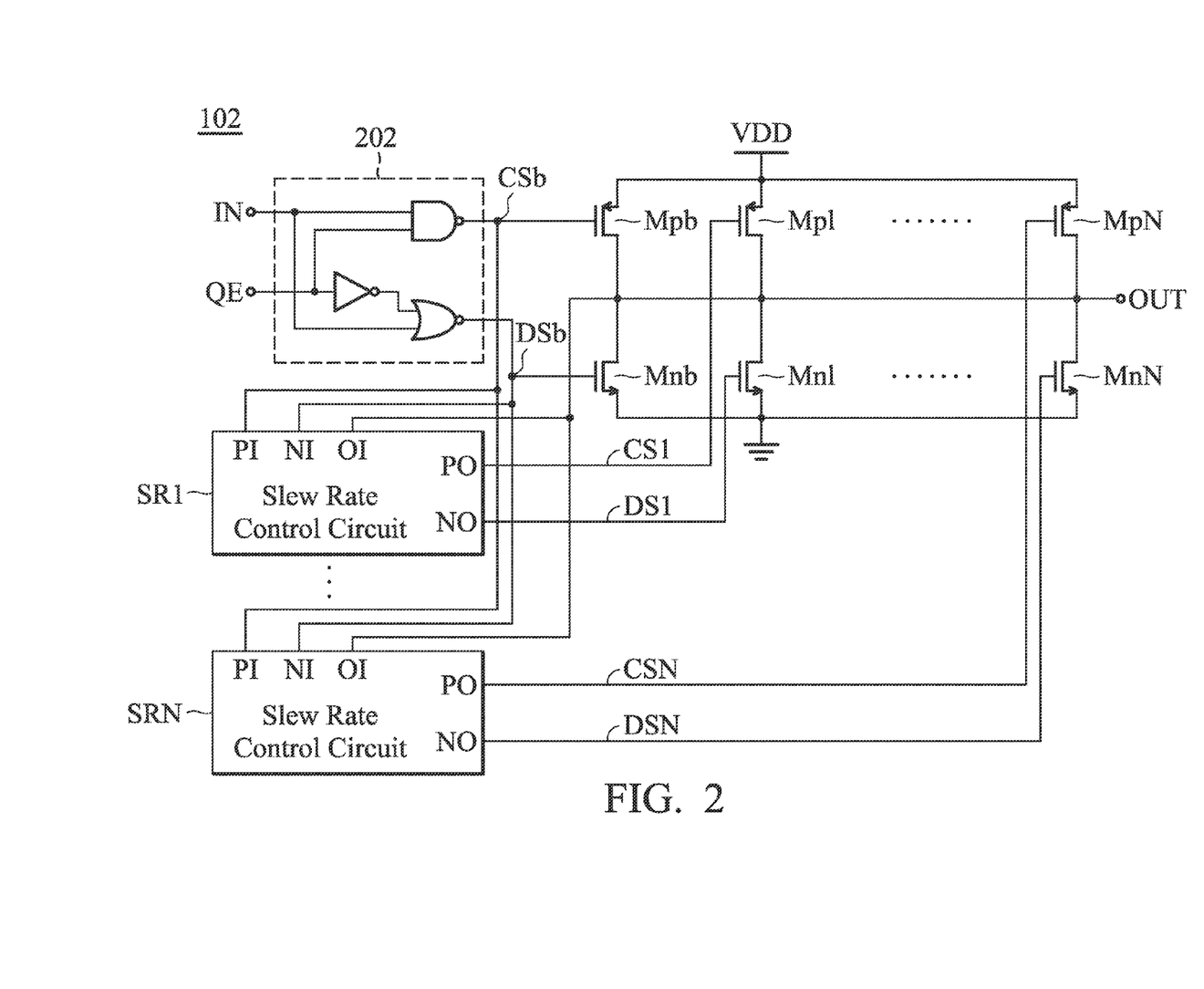
FIG. 2 depicts an slew-rate control output buffer 102 in accordance with an exemplary embodiment of the invention.

FIG. 2 depicts an exemplary embodiment of the slew-rate control output buffer 102. To perform a slew-rate control on a signal at the output pin OUT, the disclosed circuit comprises a set of basic charging and discharging transistors Mpb and Mnb as well as multiple sets of slew-rate control charging and discharging transistors (from the first set of transistors Mp1 and Mn1 to the Nth set of transistors MpN and MnN), wherein the transistors are all coupled to the output pin OUT.

This paragraph shows how the basic charging and discharging transistors Mpb and Mnb work. The output stage input signal IN may be firstly processed by a pre-driver circuit 202 in accordance with a control signal QE, to generate a basic charging transistor control signal CSb and a basic discharging transistor control signal DSb to control the basic charging transistor Mpb and the basic discharging transistor Mnb, respectively. Thus, the load capacitance at the output pin OUT (e.g., CL shown in FIG. 1 and even the parasitic capacitance shown in circuit 104) is charged/discharged according to the output stage input signal IN. Note that the pre-driver circuit 202 is not intended to limit the scope of the invention and may be replaced by any pre-driver design.

This paragraph shows how the multiple sets of slew-rate control charging and discharging transistors (from Mp1 and Mn1 to MpN and MnN) work, and, the slew rate control circuits SR1 to SRN corresponding to the multiple sets of transistors (Mp1 and Mn1 to MpN and MnN) are discussed in this paragraph as well. The slew-rate control circuits SR1 to SRN each generates one set of slew-rate control charging and discharging signals (for example, the slew-rate control circuit SR1 generates the slew-rate control charging and discharging signals CS1 and DS1 ... the Nth slew-rate control circuit SRN generates the slew-rate control charging and discharging signals CSN and DSN) based on the basic charging transistor control signal CSb, basic discharging transistor control signal DSb and the signal at the output pin OUT. The multiple sets of slew-rate control charging and discharging signals (CS1 and DS1 and so on up to CSN and DSN) control the multiple sets of slew-rate control charging and discharging transistors (Mp1 and Mn1 and so on up to MpN and MnN) to charge/discharge the load capacitance at the output pin OUT.

To sum up, the signal at the output pin OUT is fed back for a slew-rate control implemented by the multiple sets of slew-rate control charging and discharging transistors (Mp1 and Mn1 and so on up to MpN and MnN, where Mpi and Mni represent the ith set of slew-rate control charging and discharging transistors) and the slew-rate control circuits SR1 to SRN. In this manner, the actual load conditions are taken intro account in slew-rate control.

Note that the multiple sets of slew-rate control charging and discharging transistors and the multiple slew-rate control circuits may be replaced by a single set of slew-rate control charging and discharging transistors and a single slew-rate control circuit in some exemplary embodiments or, in another exemplary embodiment, the set of basic charging and discharging transistors is removed. In conclusion, any output stage design using at least one set of slew-rate control charging and discharging transistors and at least one slew-rate control circuit may be related to the invention.

Figure 3A:
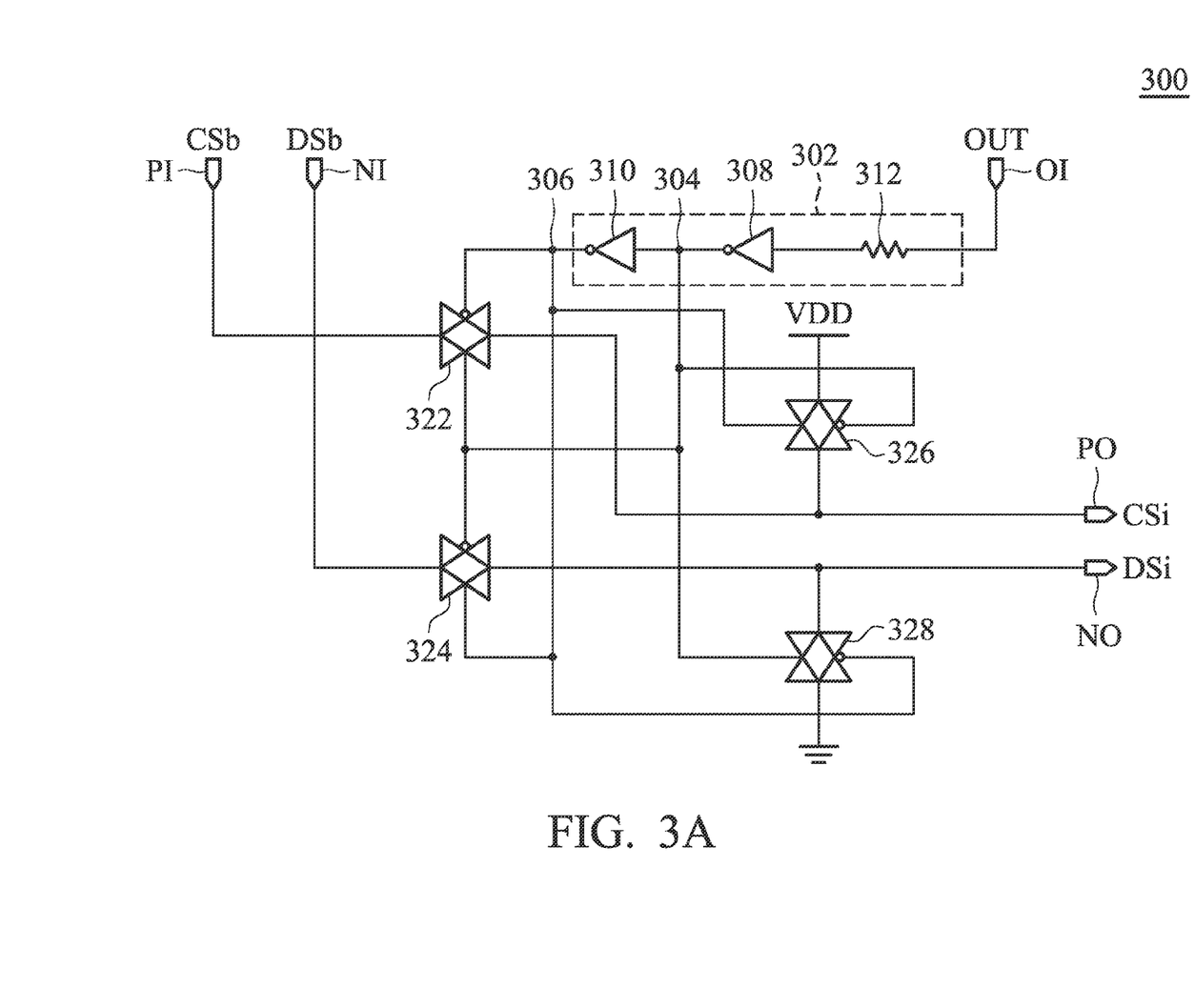
FIG. 3A to FIG. 3C show several exemplary embodiments of the slew-rate control circuit.
Figure 3B:
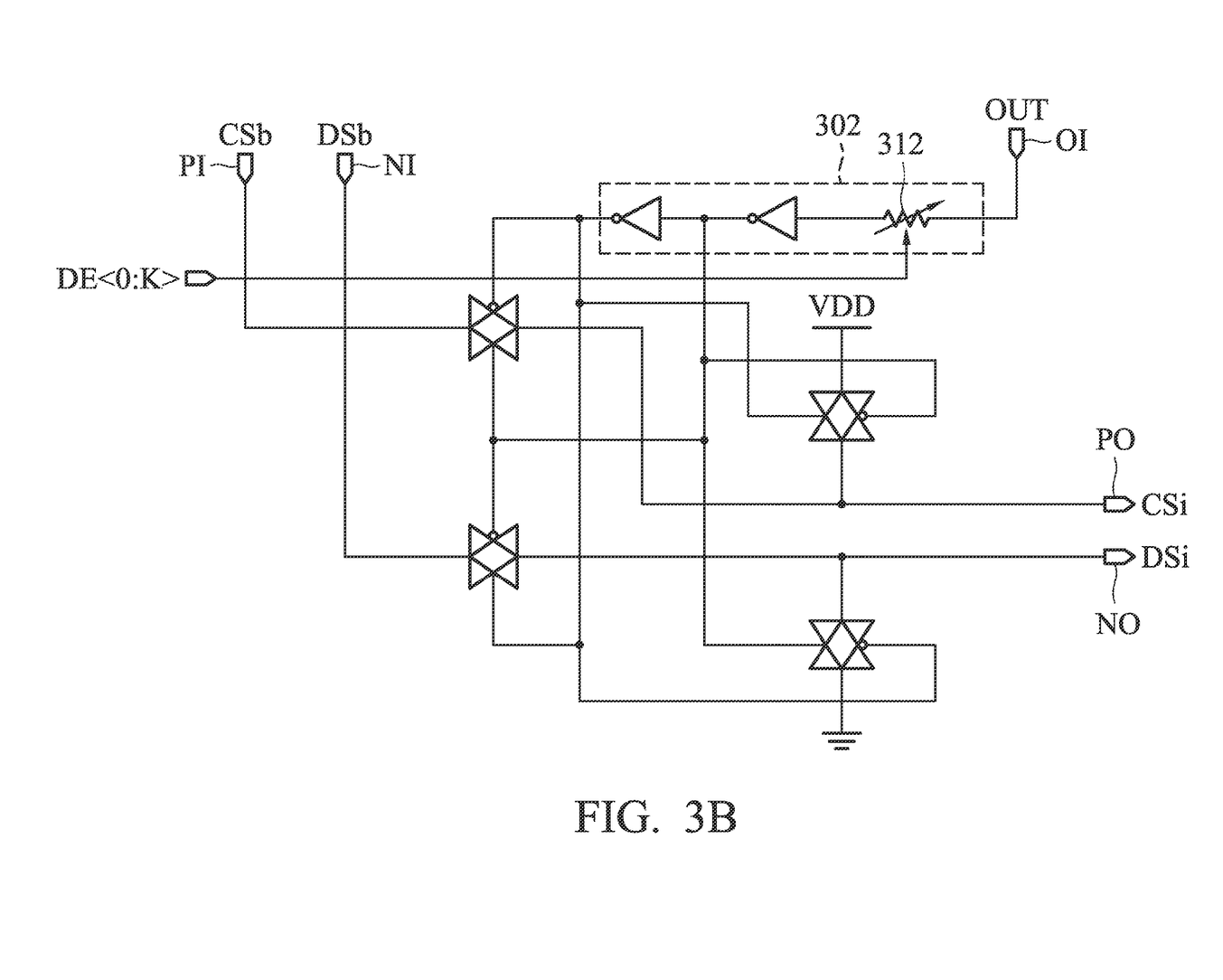
Figure 3C:
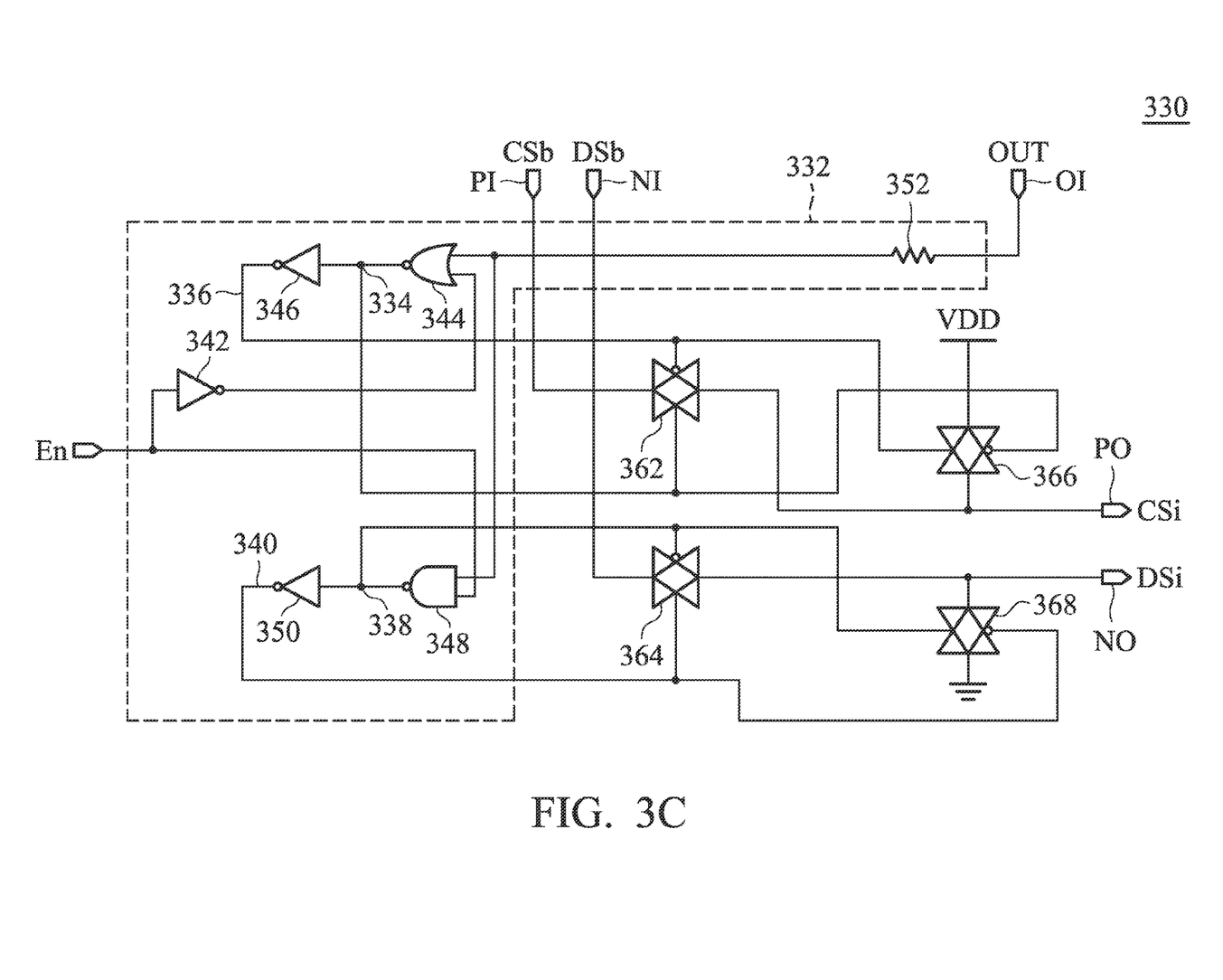

FIG. 3A to FIG. 3C show several exemplary embodiments about the slew-rate control circuits SR1 to SRN.

FIG. 3A shows a slew-rate control circuit 300, which receives the basic charging and discharging transistor control signals CSb and DSb by input terminals PI and NI, respectively, and has a feedback input node OI to be coupled to receive the signal at the output pin OUT. Further, the circuit 300 has a first output terminal PO and a second output terminal NO outputting a slew-rate control charging signal and a slew-rate control discharging signal (named CSi and DSi because the circuit 300 is the ith slew-rate control circuit SRi), respectively. Furthermore, the slew-rate control circuit 300 comprises an inverter circuit 302 and first to fourth switches (implemented by transmission gates 322, 324, 326 and 328 in this exemplary embodiment).

The inverter 302 converts the signal obtained from the output pin OUT to an inverted output signal 304 and a delayed output signal 306. In this embodiment, the inverter circuit 302 comprises inverters 308 and 310. The inverter 308 has an input terminal coupled to the output pin OUT and has an input terminal outputting the inverted output signal 304. The inverter 310 has an input terminal coupled to the output terminal of the inverter 308 and has an output terminal outputting the delayed output signal 306. Note that the resistor 312 coupled between the output pin OUT and the input terminal of the inverter 308 is an electrostatic discharge (ESD) design, which is optional and dependant on the user.

As for the first switch implemented by a transmission gate 322, a non-inverted control terminal of the transmission gate 322 is coupled to receive the inverted output signal 304 while an inverted control terminal of the transmission gate 322 is coupled to receive the delayed output signal 306. Thus, the first switch is turned on when the inverted output signal 304 is high, to couple the basic charging transistor control signal CSb to the first output terminal PO. As for the second switch implemented by the transmission gate 324, a non-inverted control terminal of the transmission gate 324 is coupled to receive the delayed output signal 306 while an inverted control terminal of the transmission gate 324 is coupled to receive the inverted output signal 304. Thus, the second switch is turned on when the delayed output signal 306 is high, to couple the basic discharging transistor control signal DSb to the second output terminal NO. As for the third switch implemented by the transmission gate 326, a non-inverted control terminal of the transmission gate 326 is coupled to receive the delayed output signal 306 while an inverted control terminal of the transmission gate 326 is coupled to receive the inverted output signal 304. Thus, the third switch is turned on when the delayed output signal 306 is high, to couple the first output terminal PO to a voltage source VDD. As for the fourth switch implemented by the transmission gate 328, a non-inverted control terminal of the transmission gate 328 is coupled to the inverted output signal 304 while an inverted control terminal of the transmission gate 328 is coupled to the delayed output signal 306. Thus, the fourth switch is turned on when the inverted output signal 304 is high, to ground the second output terminal NO.

The operations of the slew-rate control circuit 300 are discussed in the following paragraphs.

The reactions of the circuit 300 are discussed in this paragraph, in case that the signal at the output pin OUT is charged from low to high. The slew-rate control charging signal CSi first reacts to the status of the basic charging transistor control signal CSb. Thus, the slew-rate control charging transistor Mpi controlled by the signal CSi provides a charging path to speed up the raising of the voltage level of the output pin OUT. At this point, the slew-rate control discharge signal DSi is maintained at a low voltage level by the transmission gate 328, so that the slew-rate control discharging transistor Mni controlled by the signal DSi is turned off and a discharging path controlled by the transistor Mni is broken off. Note that when the voltage level of the output pin OUT is raised to be greater than a threshold value (e.g. VDD/2), the transmission gate 326 may be turned on. With the turning on of the transmission gate 326, the slew-rate control charging signal CSi is pulled up to VDD and thereby the slew-rate control charging transistor Mpi is turned off to stop the raising of the voltage level of the output pin OUT. Thus, current overshoot at the output pin OUT is suppressed. At this time, the slew-rate control discharging signal DSi reacts to the status of the basic discharging transistor signal DSb. The discharge capability of the slew-rate control discharging transistor Mni (controlled by the signal DSi) also helps to suppress the current overshoot problem.

The reactions of the circuit 300 are discussed in this paragraph, in case that the signal at the output pin OUT is discharged from high to low. The slew-rate control discharging signal DSi first reacts to the status of the basic discharging transistor control signal DSb. Thus, the slew-rate control discharging transistor Mni controlled by the signal DSi is turned on to provide a discharging path to help pull down the voltage level of the output pin OUT. At this point, the slew-rate control charging signal CSi is maintained at the high level voltage VDD by the transmission gate 326, so that the slew-rate control charging transistor Mpi controlled by the signal CSi is turned off and a charging path controlled by the transistor Mpi is broken off. Note that when the voltage level of the output pin OUT falls to lower than a threshold level (e.g. VDD/2), the transmission gate 328 is turned on. With the turning on of the transmission gate 328, the slew-rate control discharging signal DSi is maintained at a low voltage level and thereby the slew-rate control discharging transistor Mni controlled by the signal DSi is turned off to stop the pulling down of the voltage level of the output pin OUT. Thus, current overshoot at the output pin OUT is suppressed. At this time, the slew-rate control charging signal CSi reacts to the status of the basic charging transistor control signal CSb. The charge capability of the slew-rate control charging transistor Mpi (controlled by the signal CSi) also helps to suppress the current overshoot problem.

As shown, the slew-rate control and the suppression of current overshoot are both improved by the disclosure of the present invention.

In an exemplary embodiment with multiple sets of slew-rate charging and discharging transistors and a plurality of slew-rate control circuits, different slew-rate control circuits may generate distinct sets of slew-rate control charging and discharging signals. Referring to FIG. 2, the slew-rate control charging and discharging signals CSi and DSi generated from the slew-rate control circuit SRi may be different from the slew-rate control charging and discharging signals CSj and DSj generated from the slew-rate control circuit SRj, where i is an integer different from the integer j.

When the multiple slew-rate control circuits are implemented by the circuit architecture shown in FIG. 3A, the distinct sets of slew-rate control charging and discharging signals may be generated by using inverter circuits (302) with different delays. The delay of the inverter circuit 302 depends on the delay of the inverter 308 and the delay of the inverter 310. Users can design the multiple slew-rate control circuits by controlling the delays of the inverters 308 and 310.

FIG. 3B further shows another exemplary embodiment of the slew-rate control circuit, wherein the ESD resistance is implemented by a variable resistor 312. The delay of the inverter circuit 302 may be changed by controlling the resistance of the variable resistor. As shown, the resistance of the resistor 312 may be controlled by the digital control signal DE<0:k>. In such an exemplary embodiment, the multiple slew-rate control circuits may be implemented by identical circuits. The current overshoot problem is successfully suppressed by separately controlling the digital control signals (DE<0:k>) of different slew-rate control circuits.

In another exemplary embodiment, the slew-rate control circuits SR1 to SRN of FIG. 2 are selectively enabled depending on the size of load capacitance at the output pin OUT. A greater load capacitance requires more slew-rate control circuits to be enabled. FIG. 3C depicts an exemplary embodiment of such a slew-rate control circuit design.

Comparing the circuits shown in FIG. 3A and FIG. 3C, the slew-rate control circuit 330 of FIG. 3C further receives an enable signal En to be activated by the enable signal En. Further, the design of the inverter circuit and the first to fourth switches is modified in FIG. 3C in comparison with that of FIG. 3A.

Referring to FIG. 3C, the inverter circuit 332 is activated by the enable signal En to convert the signal at the output pin OUT to a first inverted output signal 334, a first delayed output signal 336, a second inverted output signal 338 and a second delayed output signal 340. The inverter circuit 332 comprises an inverter 342, a NOR gate 344, an inverter 346, an NAND gate 348 and an inverter 350. The inverter 342 has an input terminal coupled to receive the enable signal En and has an output terminal The NOR gate 344 has a first input terminal coupled to the output pin OUT, a second input terminal coupled to the output terminal of the inverter 342, and an output terminal outputting the first inverted output signal 334. The inverter 346 has an input terminal coupled to the output terminal of the NOR gate 344 and has an output terminal outputting the first delayed output signal 336. The NAND gate 348 has a first input terminal coupled to the output pin OUT, a second input terminal coupled to receive the enable signal EN, and an output terminal outputting the second inverted output signal 338. The inverter 350 has an input terminal coupled to the output terminal of the NAND gate 348 and has an output terminal outputting the second delayed output signal 340. As shown in FIG. 3C, the resistor 352 coupled between the first input pin of the NOR gate 344 and the output pin OUT is an ESD design and is an optional component dependant on the user. In an exemplary embodiment, the resistor 352 may be a variable resistor. The delay of the disclosed inverter circuit may be changed by controlling the resistance of the variable resistor.

As for the first switch implemented by the transmission gate 362, a non-inverted control terminal of the transmission gate 362 is coupled to the output terminal of the NOR gate 344 while an inverted control terminal of the transmission gate 362 is coupled to the output terminal of the inverter 346. Thus, the first switch is turned on when the voltage level of the first inverted output signal 334 is high, to couple the basic charging transistor control signal CSb to the first output terminal PO. As for the second switch implemented by the transmission gate 364, a non-inverted control terminal of the transmission gate 364 is coupled to the output terminal of the inverted 350 while an inverted control terminal of the transmission gate 364 is coupled to the output terminal of the NAND gate 348. Thus, the second switch is turned on when the voltage level of the second delayed output signal 340 is high, to couple the basic discharging transistor control signal DSb to the second output terminal NO. As for the third switch implemented by the transmission gate 366, a non-inverted control terminal of the transmission gate 366 is coupled to the output terminal of the inverter 346 while an inverted control terminal of the transmission gate 366 is coupled to the output terminal of the NOR gate 344. Thus, the third switch is turned on when the voltage level of the first delayed output signal 336 is high, to couple the first output terminal PO to the voltage source VDD. As for the fourth switch implemented by the transmission gate 368, a non-inverted control terminal of the transmission gate 368 is coupled to the output terminal of the NAND gate 348 while an inverted control terminal of the transmission gate 368 is coupled to the output terminal of the inverter 350. Thus, the fourth switch is turned on when the voltage level of the second inverted output signal 338 is high, to ground the second output terminal NO.

In the following paragraphs, how the slew-rate control circuit 330 of FIG. 3C is enable/disable is shown.

When the enable signal En is not activated (at a low voltage level), the transmission gates 362 and 364 are turned off but the transmission gates 366 and 368 are turned on. In this manner, the slew-rate control charging signal CSi is at a high level and is incapable of turning on the slew-rate control charging transistor Mpi and the slew-rate control discharging signal DSi is at a low level and is incapable of turning on the slew-rate control discharging transistor Mni. Thus, the slew-rate control circuit 330 is disabled.

When the enable signal En is activated (at a high voltage level), the signal at the output pin OUT is inverted and presented at the output terminals of the NOR gate 344 and the NAND gate 348 and is inverted again to be delayed and shown at the output terminals of the inverters 346 and 350. Thus, the first inverted output signal 334, the second inverted output signal 338, the first delayed output signal 336 and the second delayed output signal 340 are generated when the enable signal En is activated and the slew-rate control circuit 330 is enabled.

By selectively enabling/disabling the multiple slew-rate control circuits of the architecture 330, the slew-rate of the signal at the output pin OUT is precisely controlled while the current overshoot is effectively suppressed.

Note that the circuits shown in FIG. 3A to FIG. 3C are not intended to limit the slew-rate control circuit to certain designs. Any circuit generating slew-rate control charging and discharging signals based on both of an output stage input signal IN and a signal at an output pin OUT may relate to the present invention.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic chip with output signal slew-rate control, comprising:
    a slew-rate control circuit, generating a slew-rate control charging signal and a slew-rate control discharging signal based on an output stage input signal of the electronic chip and a signal at an output pin of the electronic chip;
    a slew-rate control charging transistor and a slew-rate control discharging transistor, coupled to the output pin and controlled by the slew-rate control charging signal and the slew-rate control discharging signal, respectively to charge/discharge a load capacitance at the output pin; and
    a basic charging transistor and a basic discharging transistor coupled to the output pin, wherein the basic charging and discharging transistors charges/discharges the load capacitance based on the output stage input signal.

2. The electronic chip as claimed in claim 1, further comprising a pre-driver circuit, wherein the output stage input signal is converted to a basic charging transistor control signal and a basic discharging transistor control signal by the pre-driver circuit before being supplied to the basic charging transistor, the basic discharging transistor and the slew-rate control circuit.

3. The electronic chip as claimed in claim 2, wherein the slew-rate control circuit comprises:
    a first output terminal and a second output terminal, outputting the slew-rate control charging signal and the slew-rate control discharging signal, respectively;
    an inverter circuit, converting the signal at the output pin to an inverted output signal and a delayed output signal;
    a first switch, turned on by the inverted output signal to couple the basic charging transistor control signal to the first output terminal;
    a second switch, turned on by the delayed output signal to couple the basic discharging transistor control signal to the second output terminal;
    a third switch, turned on by the delayed output signal to couple the first output terminal to a voltage source; and
    a fourth switch, turned on by the inverted output signal to ground the second output terminal.

4. The electronic chip as claimed in claim 3, wherein the inverter circuit comprises:
    a first inverter, having an input terminal coupled to the output pin and having an output terminal outputting the inverted output signal; and
    a second inverter, having an input terminal coupled to the output terminal of the first inverter and having an output terminal outputting the delayed output signal.

5. The electronic chip as claimed in claim 4, wherein the inverter circuit further comprises a variable resistor coupled between the output pin and the input terminal of the first inverter for controlling a delay of the inverter circuit, and, the slew-rate control circuit comprises:
    a first transmission gate which implements the first switch, wherein the first transmission gate has a non-inverted control terminal to be coupled to receive the inverted output signal and has an inverted control terminal to be coupled to receive the delayed output signal;
    a second transmission gate which implements the second switch, wherein the second transmission gate has a non-inverted control terminal to be coupled to receive the delayed output signal and has an inverted control terminal to be coupled to receive the inverted output signal;
    a third transmission gate which implements the third switch, wherein the third transmission gate has a non-inverted control terminal to be coupled to receive the delayed output signal and has an inverted control terminal to be coupled to receive the inverted output signal; and
    a fourth transmission gate which implements the fourth switch, wherein the fourth transmission gate has a non-inverted control terminal coupled to receive the inverted output signal and has an inverted control terminal to be coupled to receive the delayed output signal.

6. An electronic chip with output signal slew-rate control, comprising:
    a plurality of slew-rate control circuits, generating multiple sets of slew-rate control charging and discharging signals based on an output stage input signal of the electronic chip and a signal at an output pin of the electronic chip, wherein different slew-rate control circuits generate distinct sets of slew-rate control charging and discharging signals; and
    multiple sets of slew-rate control charging and discharging transistors, coupled to the output pin and controlled by the multiple sets of slew-rate control charging and discharging signals separately, to charge/discharge a load capacitance at the output pin.

7. The electronic chip as claimed in claim 6, further comprising:
    a set of basic charging and discharging transistors, coupled to the output pin and charging/discharging the load capacitance based on the output stage input signal; and
    a pre-driver circuit, wherein the output stage input signal is converted to a basic charging transistor control signal and a basic discharging transistor control signal by the pre-driver circuit before being supplied to the set of basic charging and discharging transistors and the plurality of slew-rate control circuits.

8. The electronic chip as claimed in claim 7, wherein each of the slew-rate control circuits comprises:
    a first output terminal and a second output terminal, outputting one set of slew-rate control charging and discharging signals;
    an inverter circuit, converting the signal at the output pin to an inverted output signal and a delayed output signal;
    a first switch, turned on by the inverted output signal to couple the basic charging transistor control signal to the first output terminal;

a second switch, turned on by the delayed output signal to couple the basic discharging transistor control signal to the second output terminal;

a third switch, turned on by the delayed output signal to couple the first output terminal to a voltage source; and a fourth switch, turned on by the inverted output signal to ground the second output terminal, wherein the inverter circuits of different slew-rate control circuits provide different delays.

9. The electronic chip as claimed in claim 8, wherein the inverter circuit comprises:

a first inverter, having an input terminal coupled to the output pin and an output terminal outputting the inverted output signal; and a second inverter, having an input terminal coupled to the output terminal of the first inverter and an output terminal outputting the delayed output signal, wherein the delay of the inverter circuit depends on a delay of the first inverter and a delay of the second inverter.

10. The electronic chip as claimed in claim 9, wherein the slew-rate control circuit comprises:

a first transmission gate which implements the first switch, wherein the first transmission gate has a non-inverted control terminal coupled to receive the inverted output signal and has an inverted control terminal coupled to receive the delayed output signal;

a second transmission gate which implements the second switch, wherein the second transmission gate has a non-inverted control terminal coupled to receive the delayed output signal and has an inverted control terminal coupled to receive the inverted output signal;

a third transmission gate which implements the third switch, wherein the third transmission gate has a non-inverted control terminal coupled to receive the delayed output signal and has an inverted control terminal coupled to receive the inverted output signal; and a fourth transmission gate which implements the fourth switch, wherein the fourth transmission gate has a non-inverted control terminal coupled to receive the inverted output signal and has an inverted control terminal coupled to receive the delayed output signal.

11. The electronic chip as claimed in claim 9, wherein the inverter circuit further comprises a variable resistor coupled between the output pin and the input terminal of the first inverter for delay control, and the slew-rate control circuit comprises:

a first transmission gate which implements the first switch, wherein the first transmission gate has a non-inverted control terminal coupled to receive the inverted output signal and has an inverted control terminal coupled to receive the delayed output signal;

a second transmission gate which implements the second switch, wherein the second transmission gate has a non-inverted control terminal coupled to receive the delayed output signal and has an inverted control terminal coupled to receive the inverted output signal;

a third transmission gate which implements the third switch, wherein the third transmission gate has a non-inverted control terminal coupled to receive the delayed output signal and has an inverted control terminal coupled to receive the inverted output signal; and a fourth transmission gate which implements the fourth switch, wherein the fourth transmission gate has a non-inverted control terminal coupled to receive the inverted output signal and has an inverted control terminal coupled to receive the delayed output signal.

12. An electronic chip with output signal slew-rate control, comprising:

a plurality of slew-rate control circuits, generating multiple sets of slew-rate control charging and discharging signals based on an output stage input signal of the electronic chip and a signal at an output pin of the electronic chip; and multiple sets of slew-rate control charging and discharging transistors, coupled to the output pin and controlled by the multiple sets of slew-rate control charging and discharging signals separately, to charge/discharge a load capacitance at the output pin, wherein the slew-rate control circuits are selectively enabled according to the size of the load capacitance.

13. The electronic chip as claimed in claim 12, further comprising:

a set of basic charging and discharging transistors coupled to the output pin and charging/discharging the load capacitance based the output stage input signal; and a pre-driver circuit, wherein the output stage input signal is converted to a basic charging transistor control signal and a basic discharging transistor control signal by the pre-driver circuit before being provided to the set of basic charging and discharging transistors and the slew-rate control circuits.

14. The electronic chip as claimed in claim 13, wherein the slew-rate control circuits each comprise:

a first output terminal and a second output terminal, outputting one set of slew-rate control charging and discharging signals;

an inverter circuit, converting the signal at the output pin to a first inverted output signal, a first delayed output signal, a second inverted output signal and a second delayed output signal when being enabled by an enable signal;

a first switch, turned on by the first inverted output signal to couple the basic charging transistor control signal to the first output terminal;

a second switch, turned on by the second delayed output signal to couple the basic discharging transistor control signal to the second output terminal;

a third switch, turned on by the first delayed output signal to couple the first output terminal to a voltage source; and a fourth switch, turned on by the second inverted output signal to ground the second output terminal.

15. The electronic chip as claimed in claim 14, wherein the inverter circuit comprises:

a first inverter, having an input terminal and an output terminal, wherein the input terminal of the first inverter is coupled to receive the enable signal;

a NOR gate, having a first input terminal coupled to the output pin, a second input terminal coupled to the output terminal of the first inverter, and an output terminal outputting the first inverted output signal;

a second inverter, having an input terminal coupled to the output terminal of the NOR gate and an output terminal outputting the first delayed output signal;

a NAND gate, having a first input terminal coupled to the output pin, a second input terminal coupled to receive the enable signal, and an output terminal outputting the second inverted output signal; and a third inverter, having an input terminal coupled to the output terminal of the NAND gate and an output terminal outputting the second delayed output signal.

16. The electronic chip as claimed in claim 15, wherein the inverter circuit further comprise a variable resistor with one end coupled to the output pin and another end coupled to the first input terminal of the NAND gate and the first input terminal of the NOR gate both, to control a delay of the inverter circuit.

17. The electronic chip as claimed in claim 15, wherein the slew-rate control circuit comprises:
- a first transmission gate which implements the first switch, wherein the first transmission gate has a non-inverted control terminal coupled to the output terminal of the NOR gate and has an inverted control terminal coupled to the output terminal of the second inverter;
- a second transmission gate which implements the second switch, wherein the second transmission gate has a non-inverted control terminal coupled to the output terminal of the third inverter and has an inverted control terminal coupled to the output terminal of the NAND gate;
- a third transmission gate which implements the third switch, wherein the third transmission gate has a non-inverted control terminal coupled to the output terminal of the second inverter and has an inverted control terminal coupled to the output terminal of the NOR gate; and
- a fourth transmission gate which implements the fourth switch, wherein the fourth transmission gate has a non-inverted control terminal coupled to the output terminal of the NAND gate and an inverted control terminal coupled to the output terminal of the third inverter.

* * * * *